(12) United States Patent
Tandou et al.

(10) Patent No.: US 9,070,724 B2
(45) Date of Patent: *Jun. 30, 2015

(54) VACUUM PROCESSING APPARATUS AND PLASMA PROCESSING APPARATUS WITH TEMPERATURE CONTROL FUNCTION FOR WAFER STAGE

(75) Inventors: Takumi Tandou, Asaka (JP); Masaru Izawa, Hino (JP)

(73) Assignee: Hitachi High-Technologies Corp. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/546,071

(22) Filed: Jul. 11, 2012

(65) Prior Publication Data

US 2012/0273132 A1  Nov. 1, 2012

Related U.S. Application Data

(63) Continuation of application No. 12/696,552, filed on Jan. 29, 2010.

(30) Foreign Application Priority Data

Dec. 4, 2009 (JP) ................................. 2009-276499

(51) Int. Cl.
| | | |
|---|---|---|
| C23C 16/00 | (2006.01) | |
| C23C 16/50 | (2006.01) | |
| C23F 1/00 | (2006.01) | |
| H01L 21/306 | (2006.01) | |
| H01L 21/67 | (2006.01) | |

(52) U.S. Cl.
CPC .... *H01L 21/67109* (2013.01); *H01L 21/67017* (2013.01)

(58) Field of Classification Search
USPC ......... 118/715, 728–733; 156/345.51–345.55
See application file for complete search history.

(56) References Cited

U.S. PATENT DOCUMENTS

| 6,091,060 A * | 7/2000 | Getchel et al. ................. 219/483 |
| 6,581,397 B1 * | 6/2003 | Taira et al. ....................... 62/199 |
| 2008/0023147 A1 * | 1/2008 | Yokogawa et al. ...... 156/345.53 |
| 2008/0023448 A1 | 1/2008 | Tandou et al. |
| 2008/0093057 A1 | 4/2008 | Choi et al. |
| 2008/0178608 A1 | 7/2008 | Tandou et al. |
| 2008/0289767 A1 * | 11/2008 | Tandou et al. ........... 156/345.53 |

(Continued)

FOREIGN PATENT DOCUMENTS

| JP | 2008-034409 | 2/2008 |
| JP | 2008-186856 | 8/2008 |
| JP | 2008-187063 | 8/2008 |

*Primary Examiner* — Maureen Gramaglia
*Assistant Examiner* — Tiffany Nuckols
(74) *Attorney, Agent, or Firm* — Baker Botts L.L.P.

(57) ABSTRACT

A plasma processing apparatus includes a processing chamber, a wafer table, a refrigerant passage disposed inside the wafer table in which a refrigerant flows, a refrigeration cycle comprising the refrigerant passage in the wafer table as a first evaporator in which the refrigerant is evaporated as a result of a heat-exchange therein, a compressor, a condenser and an expansion valve, a second evaporator, and a controlling unit which adjusts a number of rotations of the compressor based upon a degree of dryness of the refrigerant at a position on the refrigeration cycle after passing through the first evaporation in a range in which dry-out does not occur in the first evaporator, and the dryness of the refrigerant being determined based upon an amount of a heat exchange during the evaporation of the refrigerant in the second evaporator.

2 Claims, 8 Drawing Sheets

(56) References Cited

U.S. PATENT DOCUMENTS

2010/0126666 A1  5/2010  Tandou et al.
2010/0326094 A1  12/2010  Tandou et al.
2011/0132541 A1  6/2011  Tandou et al.
2011/0207243 A1  8/2011  Tandou et al.

* cited by examiner

VACUUM PROCESSING APPARATUS AND PLASMA PROCESSING APPARATUS WITH TEMPERATURE CONTROL FUNCTION FOR WAFER STAGE

CROSS REFERENCE TO RELATED APPLICATION

This application is a continuation of U.S. application Ser. No. 12/696,552, filed Jan. 20, 2010, the contents of which are incorporated herein by reference.

CLAIM OF PRIORITY

The present application claims priority from Japanese Patent Application JP 2009-276499 filed on Dec. 4, 2009, the contents of which are hereby incorporated by reference into this application.

FIELD OF THE INVENTION

The present invention relates to a vacuum processing apparatus and a plasma processing apparatus with a function of controlling the temperature of a wafer stage, and more particularly, to a wafer-stage temperature control device suitable for a plasma processing apparatus that carries out microfabrication processes on a sample, such as a wafer, with high accuracy.

BACKGROUND OF THE INVENTION

Along with the microfabrication of a semiconductor device, processing accuracy required for an etching process of a wafer has been increasingly strict year after year. In order to perform a highly accurate process for finely patterning a wafer surface with a plasma processing apparatus, it is important to control the temperature of the wafer surface during etching processes. However, due to the demand for a larger area of a wafer and the improvement of etching rate, high frequency electric power applied to the plasma processing apparatus tends to be increased, and large electric power in kilowatt-order has begun to be applied, in particular, for etching insulating films. The application of large electric power increases ion impact energy to the wafer surface, which involves a problem of an excessive rise in the temperature of the wafer during the etching process. Moreover, due to the demand for further improvement of processed shape accuracy, a means capable of controlling the temperature of the wafer at high speeds and providing in-plane temperature uniformity during the process has been required.

In order to control the surface temperature of the wafer in a plasma processing apparatus, it is necessary to control the surface temperature of a wafer stage (having an electrostatic chuck) which comes in contact with the back surface of the wafer through a heat transfer medium. The control of the surface temperature of a conventional wafer stage is exercised by feeding a liquid refrigerant through a passage formed inside the wafer stage. The liquid refrigerant is first adjusted to a target temperature by a cooling unit or a heating unit inside a refrigerant supply device and supplied to the passage inside the wafer stage. Such a refrigerant supply device is designed to once store the liquid refrigerant in a tank and feed the refrigerant after adjusting its temperature, and is effective in keeping the surface temperature of the wafer constant because the liquid refrigerant itself exhibits a large heat capacity. However, the refrigerant supply device is poor in temperature response, low in heat exchange efficiency, and has difficulty in achieving agile temperature control. Therefore, a recent high heat input has made the refrigerant supply device larger in size and has created a difficulty for the device in optimally controlling the temperature of the wafer surface in accordance with the progression of etching.

In view of the circumstances described above, there has been proposed a direct-expansion type refrigerant supply device (hereinafter, referred to as "a direct-expansion cooling system") in Japanese Patent Application Laid-Open Publication No. 2008-034409 in which a refrigerant circulation system evaporates a refrigerant in a refrigerant passage of the wafer stage to cool the wafer stage with a compressor for applying a high pressure to the refrigerant, a condenser for condensing the high-pressure refrigerant, and an expansion valve for expanding the refrigerant. The direct-expansion cooling system that uses latent heat generated by refrigerant evaporation exhibits high cooling efficiency and enables agile control of the refrigerant's evaporation temperature by pressure. For the reasons described above, adoption of the direct-expansion cooling system as a device for supplying a refrigerant to a wafer stage realizes highly-efficient high-speed temperature control of a semiconductor wafer during a high heat input etching process.

In addition, Japanese Patent Application Laid-Open Publication No. 2008-187063 discloses a method for determining whether a refrigerant in a refrigerant passage of a wafer stage has been completely evaporated by installing a thermometer for the refrigerant at a refrigerant inlet port and a refrigerant outlet port of the wafer stage.

Furthermore, Japanese Patent Application Laid-Open Publication No. 2008-186856 discloses a method for preventing a refrigerant in a refrigerant passage from drying out (vanish of liquid films) by controlling the degree of dryness of the refrigerant discharged from the wafer stage in order to uniformly cool the surface of the wafer stage with the direct-expansion cooling system.

SUMMARY OF THE INVENTION

With an increase in high-frequency electric power to be applied to a plasma processing apparatus, the amount of heat recovered from a wafer stage by a refrigerant supply device increases. In an etching process for an insulating film, approximately forty percent of bias power applied to a wafer transforms into heat that is then recovered by the refrigerant supply device through the wafer stage. With the increase in high-frequency electric power, attaining high cooling capability is indispensable for the refrigerant supply device. However, high power consumption that accompanies such an increase in electric power is a new problem. Replacing the conventional system with the direct-expansion cooling system can improve the cooling capability and reduce power consumption. In order to meet the needs of a further increase in cooling capability and to provide an environmentally-friendly plasma processing apparatus, it is necessary to study techniques for lowering power consumption of the direct-expansion cooling system.

The direct-expansion cooling system provides cooling by using latent heat generated at the time of transformation of a refrigerant from liquid to vapor. If the refrigerant is completely evaporated in the refrigerant passage of the wafer stage in the process of a wafer processing, the wafer stage cannot be uniformly cooled, which deteriorates in-plane temperature uniformity across the wafer stage and of course the wafer surface. In a general method to prevent deterioration, the amount of heat input from plasma in every etching process is measured in advance and an appropriate amount of a refrigerant is supplied to the wafer stage according to the heat input amount. However, the cooling system employing the method needs to supply more refrigerant than necessary in consideration of a safe ratio against dry-out of the refrigerant. Such a redundant refrigerant supplied to the wafer stage boosts the power consumption of the direct-expansion cooling system.

The direct-expansion system has a feature in which when the refrigerant is in a state of two-phase flow, i.e., a liquid phase and vapor phase, an increase in enthalpy (or dryness) does not change the temperature of the refrigerant. In other words, the refrigerant temperature before entering the wafer stage and the refrigerant temperature after having passed through the wafer stage are approximately the same as long as the refrigerant is not completely evaporated in the wafer stage, and therefore, a rise in temperature of the refrigerant that has passed through the wafer stage is what determined that the refrigerant has been completely evaporated in the refrigerant passage. Thus, as shown in Japanese Patent Application Laid-Open Publication No. 2008-187063, it can be determined whether the refrigerant has been completely evaporated in the refrigerant passage by measuring the refrigerant temperatures at the refrigerant inlet port and the refrigerant outlet port of the wafer stage.

However, even the method disclosed in Japanese Patent Application Laid-Open Publication No. 2008-187063 cannot quantitatively measure the degree of dryness of the refrigerant discharged from the wafer stage. Prevention of the dry-out of the refrigerant in the refrigerant passage (vanish of liquid films) is essential to uniformly cool the surface of the wafer stage in the direct-expansion system, and therefore, as disclosed in Japanese Patent Application Laid-Open Publication No. 2008-186856, the degree of dryness of the refrigerant discharged from the wafer stage needs to be controlled.

By the way, in view of the global environment, various industries have been requested to decrease $CO_2$ emissions. The invention of Japanese Patent Application Laid-Open Publication No. 2008-186856 does not give full consideration to reduction of power consumption and improvement of the coefficient of performance (COP: cooling capability/power consumption) of the plasma processing apparatus.

The present invention has been made to address the problems and to provide a vacuum processing apparatus and a plasma processing apparatus with a temperature control function for a wafer stage. The apparatuses can improve the coefficient of performance (COP: cooling capability/power consumption), operate with low power consumption and achieve a desired wafer temperature distribution by optimizing the amount of the refrigerant circulating in a cycle of the direct-expansion cooling system.

For the purpose of addressing the problems, a vacuum processing apparatus according to an aspect of the present invention, in which a wafer stage disposed in a vacuum processing chamber, converts process gas introduced into the vacuum processing chamber into plasma and performs surface treatment to a wafer placed on the wafer stage with the plasma, the vacuum processing apparatus comprising:

a cooling cycle including a refrigerant passage that is provided in the wafer stage and serves as an evaporator, a compressor, a condenser and an expansion valve that are disposed outside the vacuum processing chamber, wherein the rotational speed of the compressor is controlled according to the degree of dryness of a refrigerant in the refrigerant passage when the refrigerant has passed through the wafer stage to reduce the amount of the refrigerant circulating in the cooling cycle within a range in which dry-out does not occur in the evaporator.

According to the present invention that measures the degree of dryness of the refrigerant discharged from the wafer stage, an excess supply of the refrigerant to the wafer stage is suppressed, and the temperature across the wafer surface can be controlled to realize uniform in-plane temperature distribution with low power consumption.

BRIEF DESCRIPTION OF THE DRAWINGS

Exemplary embodiments of the present invention will be described in detail based on the following figures, wherein.

DETAILED DESCRIPTION OF THE INVENTION

Figure 1:
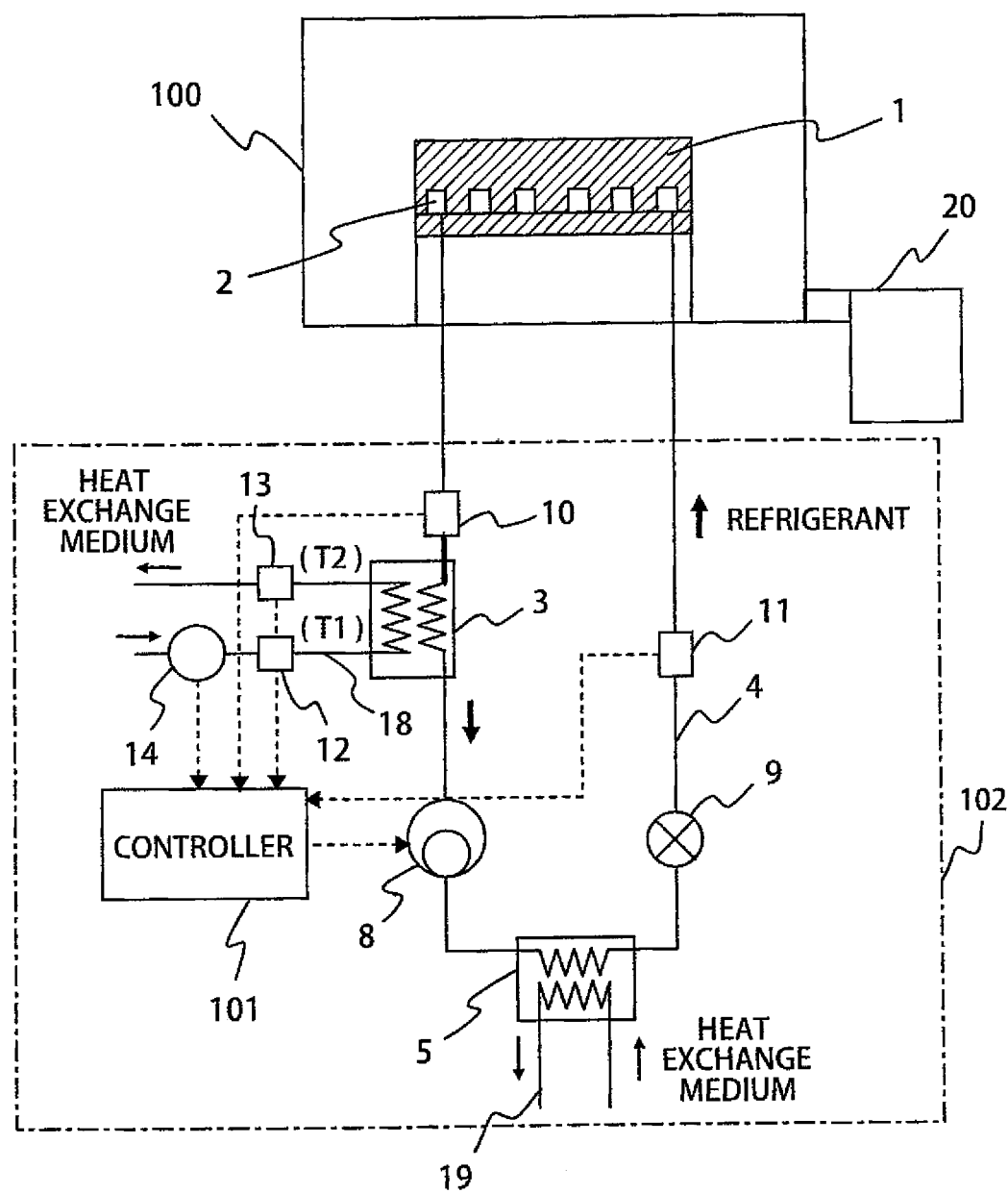
FIG. 1 is a schematic view showing an exemplary structure of a vacuum processing apparatus with a cooling system having a dryness measurement function according to a first embodiment of the present invention.

An aspect of the present invention provides a plasma processing apparatus with a direct-expansion cooling cycle for controlling the temperature of a wafer stage, the apparatus capable of providing a desired temperature distribution over a wafer with low power consumption by optimizing the amount of a refrigerant circulating in the cooling cycle. The optimization of the circulation amount of the refrigerant in the cooling cycle can be performed by measuring the degree of dryness of the refrigerant having passed through the wafer stage and controlling the rotational speed of a compressor according to the degree of dryness. Specifically, the dryness of the refrigerant having passed through the refrigerant passage in the wafer stage is controlled to achieve approximately 0.6 to 0.9. Although the degree of the dryness that triggers a dry-out phenomenon varies depending on the kind of the refrigerant and the shape of the refrigerant passage, the dryness of the refrigerant discharged from the refrigerant passage of the wafer stage can be controlled by regulating the amount of the refrigerant circulating in the cooling cycle.

In other words, the circulation amount of the refrigerant is reduced until just before the refrigerant having passed the wafer stage dries out, and is maintained at a low level. This reduces the rotational speed of the compressor and therefore reduces power consumption of the direct-expansion cooling system, and as a result the coefficient of performance (COP: cooling capability/power consumption) of the plasma processing apparatus is improved. The improvement of the COP provides high cooling capability with low power consumption.

A plasma processing apparatus according to another aspect of the present invention includes a wafer stage disposed in a vacuum processing chamber, converts process gas introduced into the vacuum processing chamber into plasma, and performs surface treatment to a wafer placed on the wafer stage with the plasma. The plasma processing apparatus includes a cooling cycle having a refrigerant passage that is disposed in the wafer stage and serves as an evaporator and a compressor, a condenser and an expansion valve that are disposed outside the vacuum processing chamber. In the plasma processing apparatus, the degree of dryness of a refrigerant having passed through the wafer stage is measured by measuring the temperature difference in a heat exchange medium, which is supplied to a refrigerant evaporator located before the compressor, between when it is supplied and when it is discharged, flow rate of the heat exchange medium, the amount of the refrigerant circulating in the cooling cycle, and the temperature of the refrigerant. The amount of the refrigerant circulating in the cooling cycle can be determined by controlling the rotational speed of the compressor according to the degree of dryness.

The plasma processing apparatus according to another aspect of the present invention includes a wafer stage disposed in a vacuum processing chamber, converts process gas introduced into the vacuum processing chamber into plasma, and performs surface treatment to a wafer placed on the wafer stage with the plasma. The plasma processing apparatus includes a cooling cycle having a refrigerant passage that is disposed in the wafer stage and serves as a condenser and a compressor, an evaporator and an expansion valve that are disposed outside the vacuum processing chamber. In the plasma processing apparatus, the evaporator is connected to a desired heat source in the plasma processing apparatus, and the temperature of the wafer stage is controlled by heating the wafer stage with exhaust heat generated in the plasma processing apparatus. The temperature control for the wafer stage with the direct-expansion cooling system that reuses exhaust heat generated in the plasma processing apparatus can provide a desired in-plane temperature distribution across the wafer with low power consumption.

Furthermore, the plasma processing apparatus according to another aspect of the present invention includes a wafer stage disposed in a vacuum processing chamber, converts process gas introduced into the vacuum processing chamber into plasma, and performs surface treatment to a wafer placed on the wafer stage with the plasma. The plasma processing apparatus includes multiple refrigerant passages that are formed in the wafer stage and have functions of the evaporator and condenser, respectively, and a cooling cycle made up with the refrigerant passages and a compressor and an expansion valve arranged outside the vacuum processing chamber, thereby recovering exhaust heat on the evaporator side, while reusing the exhaust heat on the condenser side to control in-plane temperature distribution across the wafer stage.

The exemplary embodiments of the present invention will be described below.

First Embodiment

A vacuum processing apparatus according to a first embodiment of the present invention, and more particularly, an exemplary structure of a plasma processing apparatus will be described below.

FIG. 1 is a schematic view showing a structure of a direct-expansion cooling system with a dryness measurement function according to the first embodiment of the present invention. The plasma processing apparatus includes a processing chamber 100 placed in a vacuum vessel and a wafer stage 1 placed in the processing chamber 100. The upper surface of the wafer stage has an electrostatic chuck function and is used as a wafer placement surface on which a substrate, such as a wafer, to be subjected to a process is placed. The processing chamber 100 is connected to a vacuum evacuation device 20, such as a vacuum pump, used to evacuate the interior of the processing chamber 100 for pressure reduction.

The wafer stage 1 is provided with a first evaporator 2 (a refrigerant passage) in which a refrigerant circulates. The first evaporator 2 makes up a direct-expansion cooling system together with a compressor 8, a first condenser 5, an expansion valve 9, a second evaporator 3, and a refrigerant passage 4. This cooling system includes a refrigerant thermometer 10, a refrigerant flowmeter 11, an inlet refrigerant thermometer 12 and an outlet refrigerant thermometer 13, and is controlled by a controller (or a control board) 101 using a computer. A heat exchange medium (hereinafter, referred to as "coolant") is supplied to the second evaporator 3 through a first heat medium passage 18, while a heat exchange medium (hereinafter referred to as "coolant") is supplied to the first condenser 5 through a second heat medium passage 19 for the purpose of discharging heat in the cycle.

In the first embodiment of the present invention, the inlet refrigerant thermometer 12 is provided to measure the temperature T1 of the heat medium or coolant supplied to the second evaporator 3 through the first heat medium passage 18, while the outlet refrigerant thermometer 13 is provided to measure the temperature T2 of the coolant discharged from the outlet. In addition, the amount of the coolant flowing through the first heat medium passage 18 is monitored and adjusted by a flow-rate adjuster 14. These components enable measurement of temperature differences in the coolant between being at the inlet and at the outlet ΔT (=T2−T1) and flow rates G of the coolant. The amount of heat Q absorbed from (exchange with) the coolant in the second evaporator 3 upon complete evaporation of the refrigerant can be calculated by using Equation 1, $$Q = G \cdot C \cdot \Delta T \quad \text{(Equation 1)}$$

Wherein,
Q: amount of heat exchange [W]
G: mass flow rate of coolant [kg/s]
C: specific heat of coolant [J/(kg.° C.)]
ΔT: coolant temperature difference [° C.].

The dryness X of the refrigerant having passed through the wafer stage 1 decreases with an increase in rotational speed N of the compressor 8 as shown by Equation 2.

$$X = 1 - f(N) \quad \text{(Equation 2)}$$

The dryness X of the refrigerant having been discharged from the wafer stage 1 can be calculated by using Equation 3, $$X = 1 - Q(N) / \{G'(N) \cdot L(T)\} \quad \text{(Equation 3)}$$

wherein,
X: dryness
Q(N): amount of heat exchange [W] (by Equation 1)
G'(N): mass flow rate of refrigerant [kg/s]
L(T): refrigerant evaporative latent heat [J/kg] (determined according to the kind of refrigerant and temperature).

The relationship between the rotational speed N of the compressor and refrigerant mass flow rate G' is given by Equation 4, $$G' = (g \cdot N \cdot \rho \cdot \eta) / 60 \quad \text{(Equation 4)}$$

wherein, g: amount of displacement of refrigerant per one rotation of the compressor [m$^3$/rev.]

N: rotational speed of the compressor [rev./min]

ρ(T): refrigerant density [kg/m$^3$] (determined according to the kind of refrigerant and temperature)

η: volumetric efficiency of the compressor [−]

The degree of dryness X of the refrigerant is calculated by an operation unit of the controller 101 and used to control the rotational speed N of the compressor 8.

Figure 2:
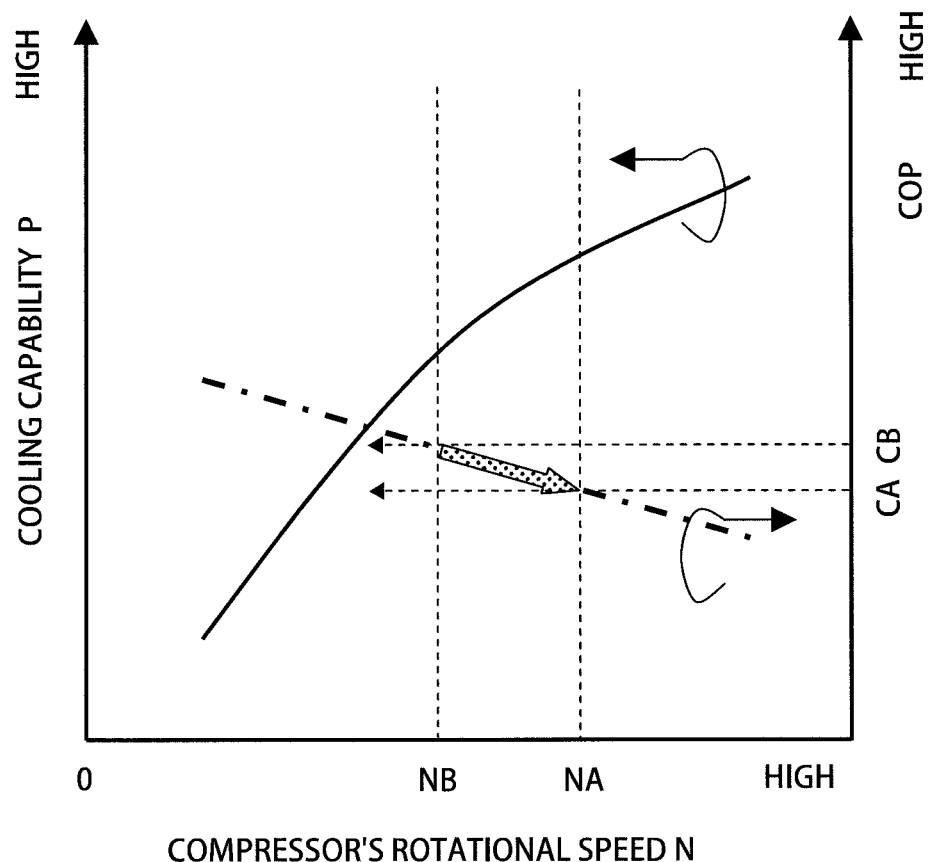
FIG. 2 is a schematic view showing the relationship of rotational speed of a compressor, cooling capability and COP property of a direct-expansion cooling system employed in the embodiment of the present invention.

FIG. 2 shows the relationship of the rotational speed N of the compressor, cooling capability P and COP (=cooling capability/power consumption). With an increase in the rotational speed of the compressor and the amount of refrigerant circulating in the cycle, the cooling capability P increases. However, the increase in the rotational speed of the compressor enhances fluid resistance in the cycle. Under these conditions, if the rotational speed of the compressor increases from NB to NA, the COP decreases from CB to CA; therefore proving that setting the amount of the refrigerant circulating in the cycle to the minimum necessary for cooling the wafer stage 1 improves the COP.

Figure 3:
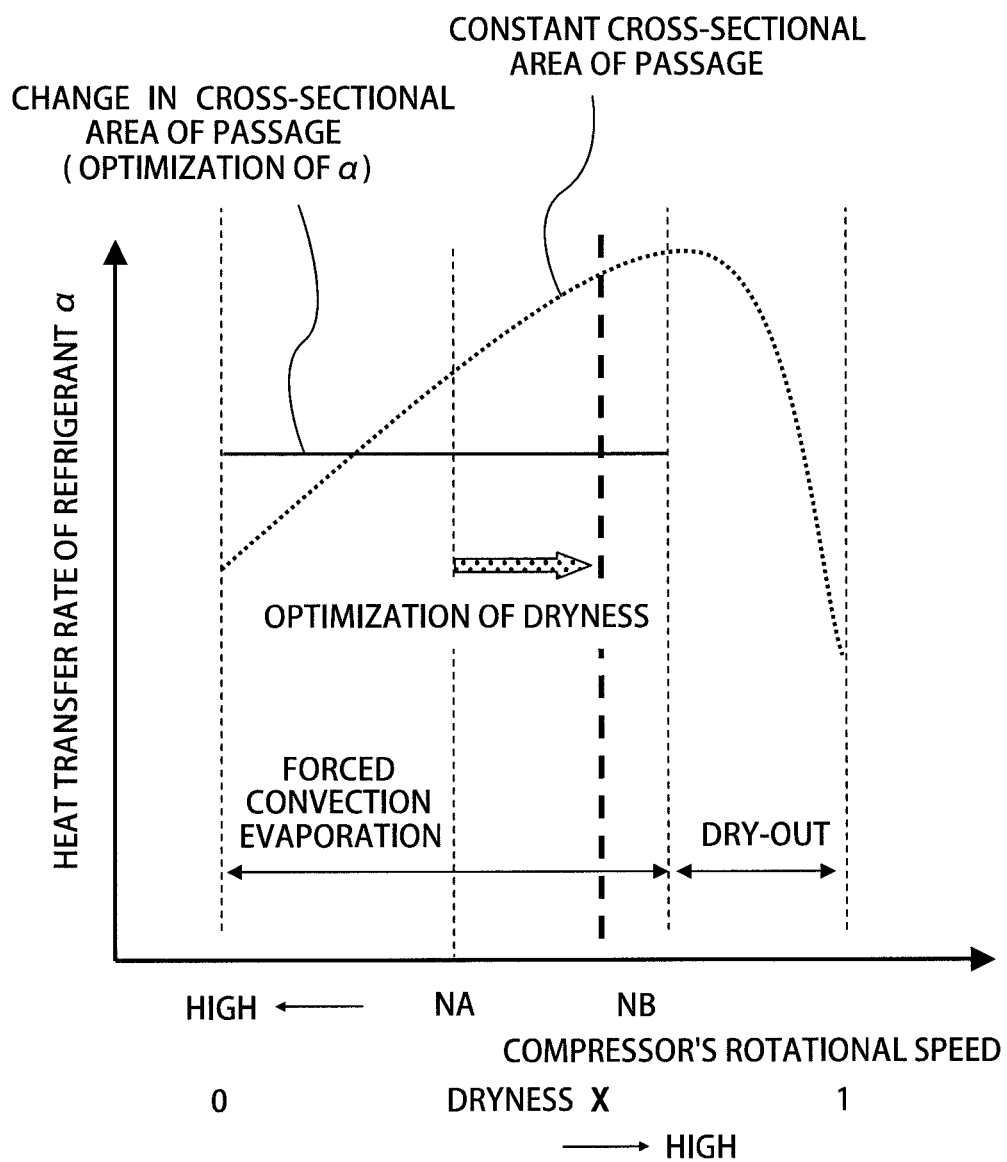
FIG. 3 is a schematic view showing the relationship of rotational speed of the compressor, the degree of dryness and the refrigerant's heat transfer rate of the direct-expansion cooling system employed in the embodiment of the present invention.

FIG. 3 shows the relationship of the degree of dryness X of the refrigerant in the first evaporator 2, the rotational speed N of the compressor and the heat transfer rate α of the refrigerant. In the direct-expansion refrigeration cycle, the wafer stage 1 is cooled by utilizing the vaporization heat of the refrigerant. During the cooling process, the degree of dryness of the refrigerant varies in the first evaporator 2, and the heat transfer mode of the refrigerant is changed from forced-convection evaporation to dry-out. This entails a change in the heat transfer rate α of the refrigerant in the first evaporator 2. Because of this, in order to ensure temperature uniformity across the electrode surface, the dryness X of the refrigerant in the first evaporator 2 needs to be controlled to fall within the forced-convection evaporation range and the cross-sectional area structure of the first evaporator 2 needs to be optimally designed according to the change in the heat transfer rate of the refrigerant to make the heat transfer rate α in the first evaporator 2 uniform across the surface. For example, the heat transfer rate α can be made uniform across the surface on which a wafer is placed by increasing the cross-sectional area of the first evaporator 2 from the inlet toward the outlet in accordance with the change in the heat transfer rate of the refrigerant.

In the direct-expansion refrigeration cycle, an increase in the dryness brings about dry-out (vanish of liquid film). The degree of dryness to produce the dry-out varies depending on the kind of refrigerant and the shape of the passage, but, in general, dryness ranging approximately from 0.6 to 0.9 causes dry-out. The occurrence of dry-out sharply drops the heat transfer rate of the refrigerant. Because the cooling capability P decreases in the dry-out state, it is difficult to ensure temperature uniformity across the electrode surface. Thus, the amount of refrigerant circulating in the cycle needs to be determined so as not to dry out the first evaporator 2, and the reduction of the circulating amount of the refrigerant within a range in which dry-out does not occur can achieve a high COP.

On the other hand, the degree of dryness X of the refrigerant discharged from the refrigerant passage in the wafer stage can be controlled by adjusting the amount of the refrigerant circulating in the cooling cycle based on the relationship expressed by Equation 2 to Equation 4. Equation 3 leads to the fact that an increase in the rotational speed N of the compressor increases the amount of heat exchange Q and refrigerant mass flow rate G'. This increase is greater in the amount of heat exchange Q than the refrigerant mass flow rate G'. Because of this, as shown by Equation 2, an increase of the rotational speed N of the compressor decreases the degree of dryness X. In other words, the more the rotational speed N of the compressor decreases, the more the degree of dryness X of the refrigerant increases.

In short, reducing the circulation amount of the refrigerant until the degree of dryness X increases, but until just before the refrigerant, which has passed through the wafer stage, enters a dry-out state, can decrease the rotational speed N of the compressor and therefore can reduce the power consumption of the direct-expansion cooling system, thereby improving the coefficient of performance (COP: cooling capability/power consumption). Thus, it is possible to obtain high cooling capability with low power consumption.

For example, in FIG. 2, the rotational speed of the compressor is decreased from NA to NB. This reduces redundant cooling capability P and improves the COP from CA to CB. FIG. 3 shows that the degree of dryness of the refrigerant having passed through the first evaporator 2 rises with the decrease in the rotational speed of the compressor from NA to NB. So, the rotational speed NB, which is the lower speed limit, of the compressor needs to be set within the range in which dry-out does not occur.

It is preferable to set the rotational speed N of the compressor so that the degree of dryness X, which is represented as "optimization of dryness" in FIG. 3, falls in a range from approximately 0.6 to 0.9 and further falls within a range very close to a range in which dry-out occurs, in other words, the degree of dryness X is in the vicinity of its upper limit in which dry-out does not occur. The upper limit of the dryness is indicated by a thick dashed line in FIG. 3. This can ensure temperature uniformity across the surface of the wafer stage 1 on which a wafer is placed (in electrode plane), while improving the COP.

Second Embodiment

Figure 4:
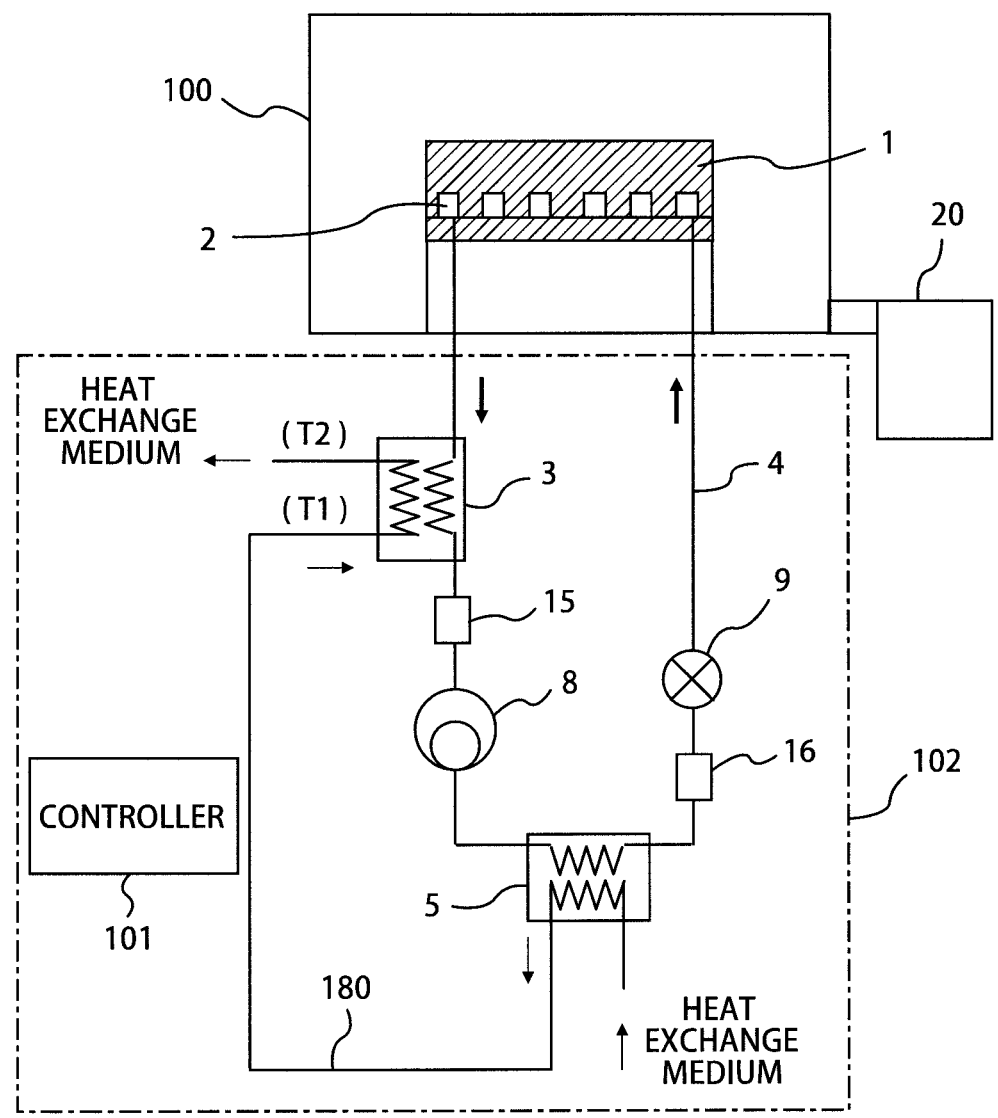
FIG. 4 is a schematic view showing an exemplary structure of a vacuum processing apparatus with a cooling system according to a second embodiment of the present invention.

Next, a second embodiment, which is a modification of the first embodiment, of the present invention will be described. FIG. 4 illustrates an example of a direct-expansion cooling system with a first condenser 5 and second evaporator 3, their coolant (heat exchange medium) passages being connected in series by a heat medium passage 180. A suction tank 15 through which only vapor can pass is connected to a refrigerant passage between the second evaporator 3 and compressor 8, while a reservoir tank 16 through which only liquid can pass is connected to the refrigerant passage between the first condenser 5 and expansion valve 9. This cooling system is controlled by a controller (or control board) 101 using a computer.

According to the second embodiment, a refrigerant that increases in temperature in the first condenser 5 exchanges heat with a coolant and resultantly raises the temperature (T1) of the coolant, thereby supplying the hot coolant to the second evaporator 3. Because the refrigerant in the cooling cycle absorbs the heat of the coolant in the second evaporator 3 and evaporates, the higher the temperature (T1) of the coolant is, the more the heat exchange rate improves and the more the refrigerant evaporates. The refrigerant (liquid) that did not evaporate in the second evaporator 3 is collected in the suction tank 15 placed upstream of the compressor 8 and is sucked into the compressor 8 after it evaporates and vaporizes.

If the refrigerant is not completely evaporated in the second evaporator 3 in the first and second embodiments, there is a possibility that the degree of dryness X cannot be accurately measured. As an insurance against this, a flowmeter can be provided in the suction tank 15 to accurately measure the degree of dryness X. The refrigerant that is not completely evaporated in the second evaporator 3 is collected in the suction tank 15 and sensed by the flowmeter. In the case where the liquid refrigerant is found in the suction tank 15, the compressor is controlled to operate at a low rotational speed N. This reduces the amount of the refrigerant circulating in the cycle, thereby facilitating complete evaporation of the refrigerant in the second evaporator 3.

On the contrary to the above description of the second embodiment, the coolant can be set to flow from the second evaporator 3 to the first condenser 5. In this case, the coolant having passed through the second evaporator 3 decreases in temperature (T1) and therefore improves the heat exchange rate in the first condenser 5. The refrigerant (vapor) that did not condense in the first condenser 5 is collected in the reservoir tank 16. This may cause reduction of the amount of the refrigerant circulating in the cycle; however, this reduction can be compensated for by supplying coolant of a low temperature into the first condenser 5.

Third Embodiment

Next, a vacuum processing apparatus, and more particularly a plasma processing apparatus, according to a third embodiment of the present invention will be described.

Figure 5:
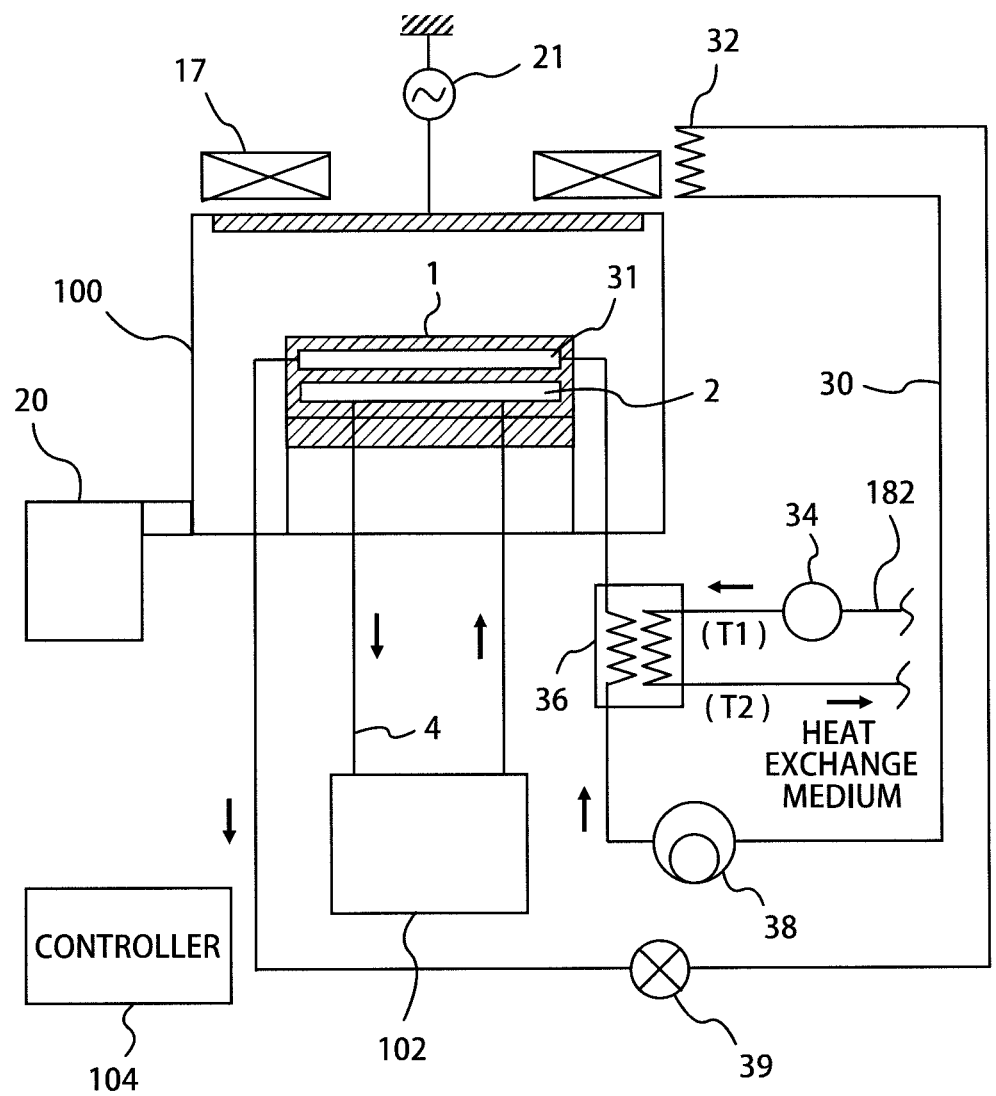
FIG. 5 is a schematic view showing an exemplary structure of a vacuum processing apparatus with a temperature adjusting system reusing exhaust heat according to a third embodiment of the present invention.

FIG. 5 illustrates a plasma processing apparatus, or, for example an etching apparatus with a temperature control system for a wafer stage, the temperature control system reusing exhaust heat in the etching apparatus. A first evaporator 2 provided in a wafer stage 1 serves as an evaporator in the direct-expansion refrigerator (first cooling system) 102 described in the first and second embodiments and can reduce the temperature of the wafer stage 1 to a low level. In addition to the first evaporator 2, the wafer stage 1 includes a third condenser (wafer-stage condenser) 31. The third condenser 31 is connected to a second condenser 36, a second compressor 38, a second expansion valve 39 and a third evaporator 32 through a second refrigerant passage 30, and these components make up a cooling system (a second cooling system). The third evaporator 32, serving as an evaporator, cools an electromagnetic coil 17 used for plasma distribution control. Heat from the electromagnetic coil 17 is recovered by the third evaporator 32 and is condensed in the third condenser (a wafer-stage condenser) 31 and then discharged, thereby controllably raising the temperature of the wafer stage 1 to a high level. In addition, adjustment of the amount of the coolant flowing into the second condenser 36 can regulate the amount of heat applied to the wafer stage 1. The coolant amount can be adjusted by a flow-rate adjuster 34. Including the refrigerator 102 and flow-rate adjuster 34, the temperature control system for the wafer stage is controlled by a controller 104.

If the controller 104 adjusts the amount of the coolant so that the heat recovered from the electromagnetic coil 17 is completely discharged by the second condenser 36, the wafer stage 1 is not subjected to heat. Specifically, the wafer placement surface, which receives heat from plasma, of the wafer stage 1 is controlled to maintain a desired temperature by the application of heat from the electromagnetic coil 17 and the cooling by the direct-expansion refrigerator 102.

Conventional apparatuses typically use a sheath heater or the like to heat the wafer stage 1. The use of the sheath heater provides a COP of 1 on the heating side, whereas the first direct-expansion cooling system can realize a COP of approximately 5 to 7. If the temperature control system using the exhaust heat of the coil 17 is applied to the first cooling system, its power consumption can be reduced to $1/5$ to $1/7$ in comparison with the power consumed by the heater to heat the wafer stage 1.

The second cooling system recovers exhaust heat from the electromagnetic coil 17 in the third embodiment; however, the exhaust heat recovery can be performed wherever heat recovery (cooling) is needed in the plasma processing apparatus. For example, the second cooling system can recover heat from a wall of the processing chamber 100 which is heated with plasma.

Fourth Embodiment

Next, a vacuum processing apparatus, and more particularly a plasma processing apparatus, according to a fourth embodiment of the present invention will be described.

Figure 6:
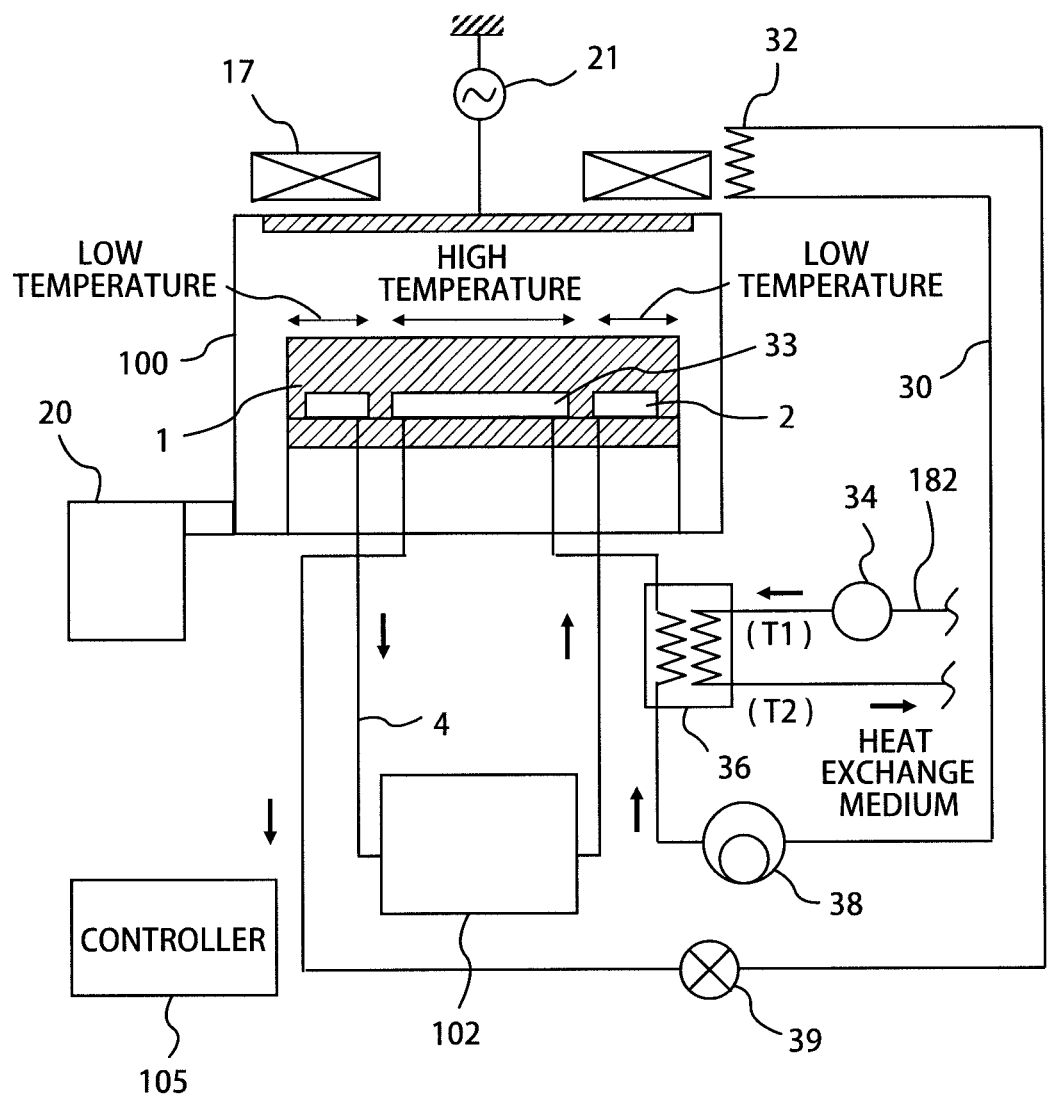
FIG. 6 is a schematic view showing an exemplary structure of a vacuum processing apparatus with a temperature adjusting system reusing exhaust heat according to a fourth embodiment of the present invention.

FIG. 6 illustrates a plasma processing apparatus, or, for example an etching apparatus with a temperature control system for a wafer stage, the temperature control system capable of controlling in-plane temperature distribution by reusing exhaust heat in the etching apparatus. Multiple refrigerant passages for heating and cooling are formed in a wafer stage 1 to control temperature distribution of a multi-zoned wafer placement surface. Specifically, in the fourth embodiment, a first evaporator 2, which serves as an evaporator of the direct-expansion refrigerator (first cooling system) 102, is formed in an area corresponding to a radially outer area of the wafer placement surface of the wafer stage 1. On the other hand, a third condenser (wafer-stage condenser) 33 is formed in an area corresponding to a radially inner area of the wafer stage 1. The third condenser 33 is connected to a second condenser 36, a second compressor 38, a second expansion valve 39 and a third evaporator 32 through a refrigerant passage 30, and these components make up a second cooling system. The third evaporator 32, serving as an evaporator, cools an electromagnetic coil 17 used for plasma distribution control. The amount of the coolant can be adjusted by a flow-rate adjuster 34. There are an inlet refrigerant thermometer that measures temperature T1 of coolant supplied to the second evaporator 36 through a heat medium passage 182 and an outlet refrigerant thermometer that measures temperature T2 of the coolant discharged from the second evaporator 36. In addition, a flow-rate adjuster 34 is provided to monitor and adjust the amount of the coolant flowing in the heat medium passage 182. This structure enables measurement of temperature difference in coolant between being at the inlet and at the outlet $\Delta T$ ($=T2-T1$) and flow rate G. Including the refrigerator 102 and flow-rate adjuster 34, the temperature control system is controlled by a controller 105.

In the fourth embodiment, under the control of a controller 105, the radially inner area of the wafer placement surface of the wafer stage 1 is controllably maintained at a high temperature by condensing the heat recovered from the electromagnetic coil 17 in the third condenser 33 to discharge the heat, while the radially outer area of the wafer placement surface of the wafer stage 1 is controllably maintained at a low temperature by the first evaporator 2.

Adjustment of the amount of the coolant flowing into the second condenser 36 can regulate the amount of heat applied to the radially inner area of the wafer stage 1. If the controller 105 adjusts the amount of the coolant so that the heat recovered from the electromagnetic coil 17 is completely discharged by the second condenser 36, the wafer stage 1 is not subjected to heat.

According to the fourth embodiment, the temperature of the wafer placement surface of the wafer stage 1 is controlled to obtain a desired in-plane temperature distribution by the application of heat from the second cooling system with the electromagnetic coil 17 used as a heat source and cooling by the first cooling system (refrigerator 102). The heat source can be wherever heat recovery (cooling) is needed in the plasma processing apparatus. The plasma processing apparatus using heat recovered from exhaust heat can operate with lower power consumption in comparison with an apparatus using a heater to control the in-plane temperature distribution across the wafer stage.

Fifth Embodiment

Next, a vacuum processing apparatus, and more particularly a plasma processing apparatus, according to a fifth embodiment of the present invention will be described.

Figure 7:
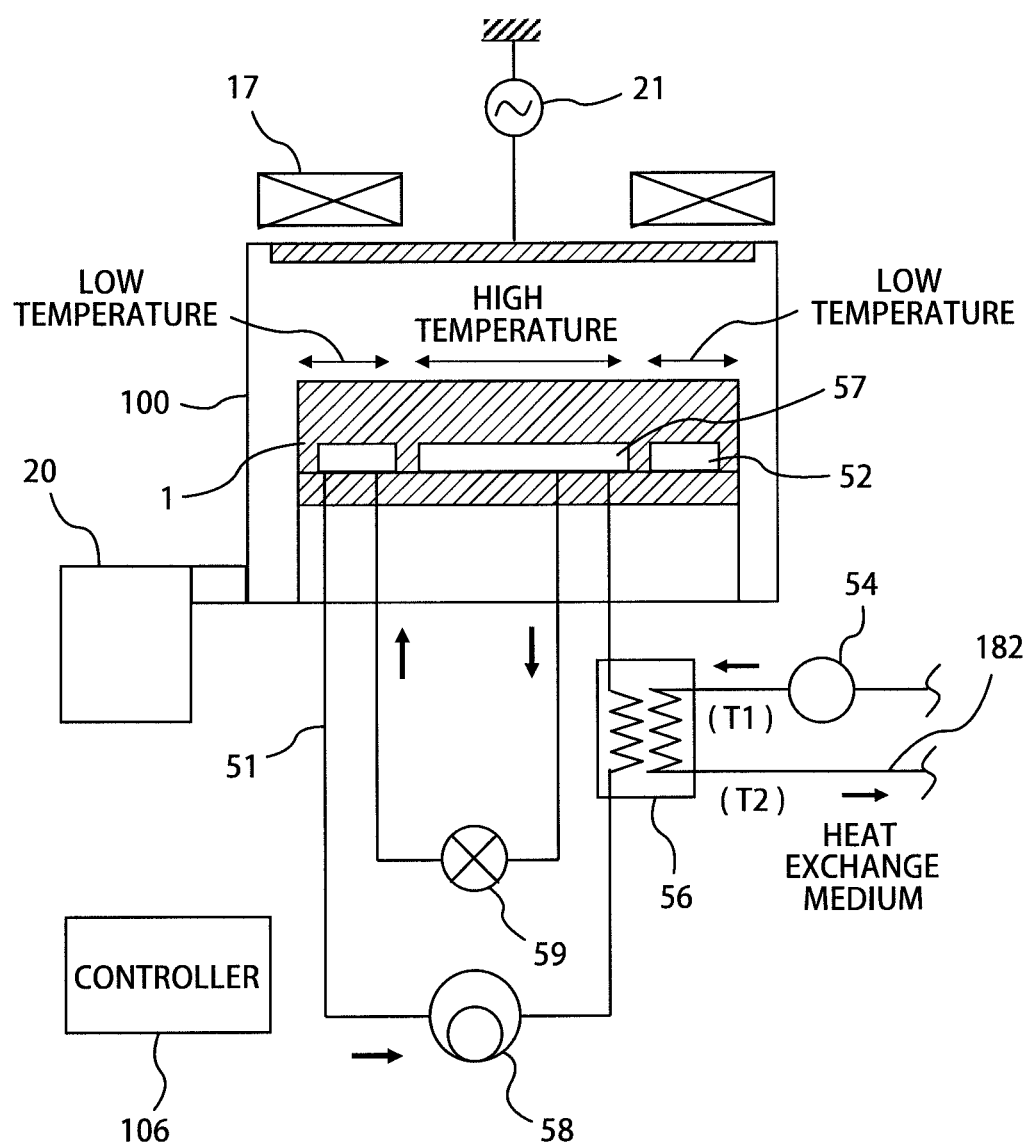
FIG. 7 is a schematic view showing an exemplary structure of a vacuum process apparatus with a temperature adjusting system reusing heat within a wafer stage according to a fifth embodiment of the present invention.

FIG. 7 illustrates a system that controls in-plane temperature distribution by recovering heat from a wafer stage 1. In the fifth embodiment, a cooling system includes a third condenser (a wafer-stage condenser) 57 placed on the radially center side of the wafer stage 1, a first evaporator 52 placed on the radially outer side, a compressor 58, a second condenser 56, an expansion valve 59 and a refrigerant passage 51 that connects these components. The cooling system is controlled by a controller 106. In this cooling system, the third condenser 57 functions as a condenser, while the first evaporator 52 functions as an evaporator. As is the case of the example shown in FIG. 6, the wafer stage 1 has an inner passage (a third condenser 57) used for heating and an outer passage (a first evaporator 52) used for cooling.

Moreover, there are an inlet refrigerant thermometer that measures temperature T1 of the coolant supplied to the second evaporator 56 through a heat medium passage 182 and an outlet refrigerant thermometer that measures temperature T2 of the coolant discharged from the second evaporator 56. A flow-rate adjuster 54 is provided to monitor and adjust the amount of the coolant flowing in the heat medium passage 182. This structure enables measurement of temperature difference in the coolant between being at the inlet and at the outlet $\Delta T$ (=T2−T1) and flow rate G.

According to the fifth embodiment, the heat recovered from the first evaporator 52 is supplied to the third condenser 57 placed in the same cooling system as the first evaporator 52, in other words, recycling of heat is performed within the wafer stage 1, and therefore the temperature of the wafer placement surface of the wafer stage 1 can be controlled to achieve a desired in-plane temperature distribution with low power consumption.

In the case of the cooling system of FIG. 7, even if the amounts of heat generated during heating and cooling are constant, it is deemed that the set cooling and heating temperatures of the refrigerant may shift to a high level with the passage of time because heat generated by the compressor 58 and so on raises the enthalpy (an amount of heat per kilogram of refrigerant) in the cooling system. However, the controller 106 can optimally control the amount of coolant to be supplied to the second condenser 56 by using the flow-rate adjuster 54 to suppress the rise of the enthalpy in the cooling system, thereby maintaining the desired in-plane temperature distribution across the wafer placement surface of the wafer stage 1.

According to the fifth embodiment, recycling of the heat within the wafer stage can provide a desired in-plane temperature distribution across both the outer side and inner side of the wafer placement surface of the wafer stage with low power consumption.

Sixth Embodiment

Figure 8:
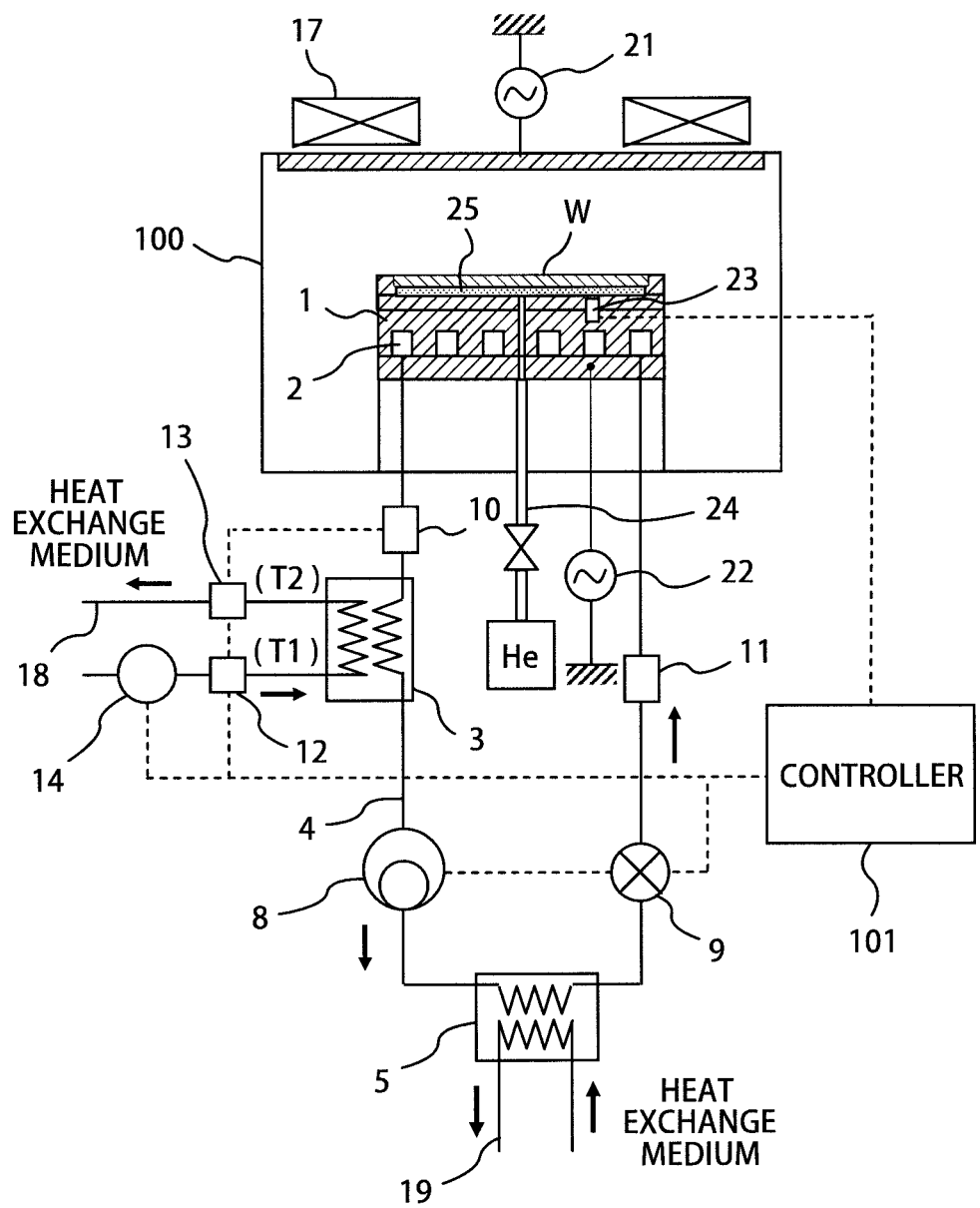
FIG. 8 illustrates an exemplary structure of a plasma processing apparatus according to the fifth embodiment of the present invention.

Next, the operation of an etching apparatus according to a sixth embodiment of the present invention will be briefly described with reference to FIG. 8. This description will provide an example in which a vacuum processing apparatus of the first embodiment performs an etching process to a wafer.

First, a wafer W is carried into a processing chamber 100 and placed and fixed on a wafer stage 1. Then, the processing chamber 100 is supplied with a process gas and adjusted to maintain at a predetermined process pressure. Next, power supply from a high-frequency antenna power source 21 and a high-frequency bias power source 22 and formation of a magnetic field by an electromagnetic coil 17 create plasma that is used to perform an etching process. Necessary procedures to control wafer temperature during the process are programmed in advance and stored as a program in a storage device or memory in a controller (or a control board) 101 together with necessary data. The controller 101 monitors temperature information from a temperature sensor 23 of the wafer stage 1 while performing feedback control and regulating the compressor 8 and expansion valve 9 to adjust the flow rate and evaporation temperature of the refrigerant.

Helium gas 25 is supplied from a heating gas feeding system 24 to a space between the front surface (a wafer placement surface) of the wafer stage 1 and the back surface of the wafer W to enable heating of the wafer stage 1 and wafer W in the processing chamber 100 even if it is maintained under vacuum. In addition, the degree of dryness X of the refrigerant in the wafer stage 1 is monitored by using the relationships derived from Equations 1 to 4 based on information about processing conditions of the wafer (i.e., the amount of plasma heat input to the wafer stage, etc.), information about the coolant of the second evaporator 3 (T1, T2, etc.) and information about the amount of refrigerant circulating in the cooling cycle and refrigerant temperature. The monitoring of dryness is effective to check whether the amount of the refrigerant flowing in the cycle is enough low within a range dry-out does not occur inside the wafer stage 1. In other words, the degree of dryness X of the refrigerant to be discharged from the wafer stage 1 is calculated from an amount of heat absorbed from (exchanged with) the coolant at the complete evaporation of the refrigerant in the second evaporator 3, a circulation amount of the refrigerant and a temperature of the refrigerant, whereby the rotational speed N of the compressor 8 is controlled so as to obtain a high COP within a range in which the refrigerant does not dry in the wafer stage 1.

More specifically, as shown in FIG. 3, the rotational speed N of the compressor 8 is decreased to a speed as low as possible with the degree of dryness X of the refrigerant falling in a range of approximately 0.6 to 0.9 and with the amount of the refrigerant falling just above the range dry-out occurs, thereby realizing the low flow rate control and therefore improving the COP. In case the degree of dryness X increases to the dry-out occurrence range as a result of the low flow rate control as shown in FIG. 3, the rotational speed N of the compressor 8 is increased to reduce the degree of dryness X of the refrigerant in the wafer stage 1. Adoption of the structures and control methods enables in-plan temperature uniformity across the wafer W and operation of the direct-expansion cooling system with a high COP.

The sixth embodiment describes an example of etching processes using the apparatus presented in the first embodiment; however, it is needless to say that the etching processes can be carried out in the same manner with the apparatuses presented in the other embodiments.

The temperature adjustment unit for the wafer stage proposed in the present invention is not limited to the above-described embodiments, but applicable to all kinds of vacuum processing apparatus requiring accurate wafer surface temperature control, such as an ashing apparatus, a sputtering apparatus, an ion implantation apparatus, a resist coating apparatus, a plasma CVD apparatus, a flat panel display manufacturing apparatus and a solar cell manufacturing apparatus.

It should be understood by those skilled in the art that various modifications, combinations, sub-combinations and alterations may occur depending on design requirements and other factors insofar as they are within the scope of the appended claims or the equivalents thereof.

What is claimed is:

1. A plasma processing apparatus comprising:
a processing chamber disposed inside a vacuum container in which a plasma is generated;
a wafer table disposed in the processing chamber on which a wafer to be processed by using the plasma is located;
a refrigerant passage disposed inside the wafer table in which a refrigerant flows;
a refrigeration cycle comprising the refrigerant passage in the wafer table as a first evaporator in which the refrigerant is evaporated as a result of a heat-exchange therein, a second evaporator disposed in an outside of the processing chamber, a compressor, a condenser and an expansion valve, wherein the first evaporator, the second evaporator, the compressor, the condenser, and the expansion valve are coupled and the refrigerant circulates in this order;
a heat exchange medium passage, a heat exchange medium provided in the heat exchange medium passage, the heat exchange medium being configured to exchange heat with the second evaporator,
wherein the second evaporator is disposed between the first evaporator and the compressor on the refrigeration cycle in which the refrigerant from the first evaporator flows, and the second evaporator is configured to evaporate the refrigerant in a liquid state flown out of the first evaporator using heat exchange with the heat exchange medium provided in the heat exchange medium passage; and
a controlling unit configured to adjust a flow rate of the refrigerant in the refrigerant cycle based upon a degree of dryness of the refrigerant at a position on the refrigeration cycle after passing through the first evaporator and before entering the second evaporator in a range in which the refrigerant at an exit of the first evaporator is maintained in a gas-liquid stage in a two-phase state of gas-liquid, the second evaporator evaporating the refrigerant in a liquid stage,
wherein the degree of dryness of the refrigerant is determined based upon a difference of temperatures of the heat exchange medium at a position of a supply side and at a position of a discharge side and a flow rate of the heat exchange medium, and a temperature and the flow rate of the refrigerant in the refrigeration cycle.

2. A plasma processing apparatus comprising:
a processing chamber disposed inside a vacuum container in which a plasma is generated;
a wafer table disposed in the processing chamber on which a wafer to be processed by using the plasma is located;
a refrigerant passage disposed inside the wafer table in which a refrigerant flows;
a refrigeration cycle comprising the refrigerant passage in the wafer table as a first evaporator in which the refrigerant is evaporated as a result of a heat-exchange therein, a second evaporator disposed in an outside of the processing chamber, a compressor, a condenser and an expansion valve, wherein the first evaporator, the second evaporator, the compressor, the condenser, and the expansion valve are coupled and the refrigerant circulates in this order;
a heat exchange medium passage, a heat exchange medium provided in the heat exchange medium passage, the heat exchange medium being configured to exchange heat with the second evaporator,
wherein the second evaporator is disposed between the first evaporator and the compressor on the refrigeration cycle in which the refrigerant from the first evaporator flows, and the second evaporator is configured to evaporate the refrigerant in a liquid state flown out of the first evaporator using heat exchange with the heat exchange medium provided in the heat exchange medium passage; and
a controlling unit configured to adjust a flow rate of the refrigerant in the refrigerant cycle based upon a degree of dryness of the refrigerant at a position on the refrigeration cycle after passing through the first evaporator and before entering the second evaporator in a range in which the refrigerant at an exit of the first evaporator is maintained in a gas-liquid stage in a two-phase state of gas-liquid, the second evaporator evaporating the refrigerant in a liquid stage,
wherein the degree of dryness of the refrigerant is determined based upon an amount of the heat exchange during the evaporation of the refrigerant in the second evaporator, and
wherein the degree of dryness of the refrigerant is determined based upon a difference of temperatures of the heat exchange medium at a position of a supply side and at a position of a discharge side and a flow rate of the heat exchange medium, and a temperature and the flow rate of the refrigerant in the refrigeration cycle.

* * * * *